(12) United States Patent
Parascandola

(10) Patent No.: US 9,763,333 B2
(45) Date of Patent: Sep. 12, 2017

(54) SHARED RESISTOR PAD BYPASS

(71) Applicant: James Michael Parascandola, Clay, NY (US)

(72) Inventor: James Michael Parascandola, Clay, NY (US)

(73) Assignee: Cooper Technologies Company, Houston, TX (US)

( * ) Notice: Subject to any disclaimer, the term of this patent is extended or adjusted under 35 U.S.C. 154(b) by 263 days.

(21) Appl. No.: 14/642,346

(22) Filed: Mar. 9, 2015

(65) Prior Publication Data

US 2016/0270226 A1 Sep. 15, 2016

(51) Int. Cl.
*H05K 3/22* (2006.01)
*H05K 1/02* (2006.01)

(52) U.S. Cl.
CPC .......... *H05K 3/222* (2013.01); *H05K 1/029* (2013.01); *H05K 2201/0979* (2013.01); *H05K 2201/10022* (2013.01); *H05K 2201/10106* (2013.01)

(58) Field of Classification Search
None
See application file for complete search history.

(56) References Cited

U.S. PATENT DOCUMENTS

| | | | | |
|---|---|---|---|---|
| 4,298,856 A | * | 11/1981 | Schuchardt | H01C 17/23 29/620 |
| 4,874,907 A | * | 10/1989 | Ishikawa | G01R 31/2818 174/261 |
| RE33,859 E | * | 3/1992 | Gurol | H01C 17/242 174/564 |
| 5,266,747 A | * | 11/1993 | Gheorghiu | H05K 1/0295 174/254 |
| 5,729,438 A | * | 3/1998 | Pieper | H05K 1/023 174/51 |
| 5,805,428 A | | 9/1998 | Singer | |
| 6,134,117 A | * | 10/2000 | Funk | H01G 4/255 174/250 |
| 6,225,141 B1 | * | 5/2001 | Wenner | G01K 15/00 361/748 |

(Continued)

FOREIGN PATENT DOCUMENTS

| | | |
|---|---|---|
| CN | 201667640 | 12/2010 |
| CN | 103889140 | 6/2014 |

(Continued)

*Primary Examiner* — Jeremy C Norris
*Assistant Examiner* — Muhammed Azam
(74) *Attorney, Agent, or Firm* — King & Spalding LLP

(57) ABSTRACT

The electrical circuit can include a line circuit portion having a number of shared resistor pads, where each shared resistor pad is electrically coupled to an electrically conductive line lead, where the electrically conductive line lead carries a voltage capable of operating an electrical load. The electrical circuit can also include a load circuit portion comprising a number of unshared resistor pads. The electrical circuit can further include at least one zero ohm resistor electrically coupled to at least one shared resistor pad. The at least one zero ohm resistor can be configurable after manufacturing the printed circuit board. The load circuit portion can be electrically isolated from the line circuit portion in the absence of the at least one zero ohm resistor being further electrically coupled to at least one unshared resistor pad.

18 Claims, 5 Drawing Sheets

(56) References Cited

U.S. PATENT DOCUMENTS

| | | | |
|---|---|---|---|
| 6,274,824 B1* | 8/2001 | Rueda-Aguilocho | H05K 1/029 174/261 |
| 6,444,922 B1* | 9/2002 | Kwong | H05K 1/14 174/255 |
| 6,985,365 B2* | 1/2006 | Krontz | G06F 13/4027 333/161 |
| 7,245,501 B2 | 7/2007 | Kotson et al. | |
| 8,188,824 B2* | 5/2012 | Yan | H01F 17/04 336/192 |
| 8,253,512 B2 | 8/2012 | Ou | |
| 8,456,457 B2 | 6/2013 | He | |
| 2001/0026211 A1* | 10/2001 | Shindoh | H01C 17/12 338/308 |
| 2002/0075610 A1* | 6/2002 | Schadewald, Jr. | G11B 5/40 360/323 |
| 2002/0097107 A1* | 7/2002 | Burns | H01P 5/10 333/26 |
| 2003/0011319 A1* | 1/2003 | Hein | H05B 41/282 315/224 |
| 2003/0051088 A1* | 3/2003 | Ho | H05K 7/1445 710/300 |
| 2003/0156443 A1* | 8/2003 | Moriarty | G11C 5/04 365/63 |
| 2003/0157816 A1* | 8/2003 | Kiehl | H05K 1/0246 439/68 |
| 2004/0145038 A1* | 7/2004 | Numazaki | H01L 23/345 257/675 |
| 2004/0183743 A1* | 9/2004 | Reasoner | G06K 7/10336 343/895 |
| 2004/0214452 A1* | 10/2004 | Freeman | H01C 17/06586 438/795 |
| 2004/0235326 A1* | 11/2004 | Reisinger | H05K 1/0259 439/181 |
| 2004/0239474 A1* | 12/2004 | Dunn | H01C 7/005 338/22 R |
| 2005/0050959 A1* | 3/2005 | Ooba | G01L 1/2287 73/775 |
| 2005/0052854 A1* | 3/2005 | Kotson | H05K 1/029 361/760 |
| 2005/0225423 A1* | 10/2005 | Hsu | G01R 31/2818 338/47 |
| 2006/0040094 A1* | 2/2006 | Mizuno | B29C 45/1418 428/209 |
| 2006/0139900 A1* | 6/2006 | Kuo | H05K 1/0292 361/760 |
| 2006/0214259 A1* | 9/2006 | Spaunhorst | H01H 69/022 257/529 |
| 2006/0262477 A1* | 11/2006 | Kondo | H01C 1/146 361/118 |
| 2008/0059685 A1* | 3/2008 | Hsu | G06F 13/4068 710/314 |
| 2008/0134500 A1* | 6/2008 | Ishii | H05K 1/0259 29/831 |
| 2008/0151514 A1* | 6/2008 | Yancey | H05K 1/0262 361/761 |
| 2009/0212900 A1* | 8/2009 | Szwarc | H01C 1/14 338/320 |
| 2010/0012365 A1* | 1/2010 | Hsieh | H05K 1/029 174/261 |
| 2010/0155106 A1* | 6/2010 | Britton | H05K 1/0269 174/250 |
| 2010/0252305 A1* | 10/2010 | Choi | H01C 1/148 174/252 |
| 2010/0254108 A1* | 10/2010 | Kim | G09G 3/3696 361/782 |
| 2011/0009926 A1* | 1/2011 | Lin | A61N 1/08 607/60 |
| 2011/0155437 A1* | 6/2011 | Wang | H05K 1/025 174/261 |
| 2012/0000064 A1* | 1/2012 | Bendix | H05K 1/167 29/593 |
| 2012/0014080 A1* | 1/2012 | Feng | H05K 1/0295 361/784 |
| 2012/0051005 A1* | 3/2012 | Vanfleteren | H01L 21/565 361/749 |
| 2012/0105386 A1* | 5/2012 | He | G06F 3/1438 345/204 |
| 2014/0331532 A1* | 11/2014 | Deppiesse | F21S 4/005 40/541 |
| 2016/0270226 A1* | 9/2016 | Parascandola | H05K 3/222 |

FOREIGN PATENT DOCUMENTS

| | | |
|---|---|---|
| JP | H09115578 | 5/1997 |
| WO | 2014056977 | 4/2014 |

* cited by examiner

SHARED RESISTOR PAD BYPASS

TECHNICAL FIELD

The present disclosure relates generally to electrical circuits on printed circuit boards, and more particularly to systems, methods, and devices for configuring electrical circuits on printed circuit boards.

BACKGROUND

Printed circuit boards often have a number of electrical circuits disposed on them. Because space on the printed circuit board is limited, the electrical circuits disposed on a printed circuit board are often confined to a limited space. As a result of the limited space, adverse electrical conditions can occur to one or more electrical circuits on a printed circuit board, particularly if an electrical circuit is not in use or part of an electrical circuit is not populated, creating an open circuit. In some cases, electrical circuits on a printed circuit board can be configurable, but even in such a case, the electrical circuits can still be at risk of such adverse electrical conditions as dielectric breakdown.

SUMMARY

In general, in one aspect, the disclosure relates to an electrical circuit on a printed circuit board. The electrical circuit can include a line circuit portion having a number of shared resistor pads, where each shared resistor pad is electrically coupled to an electrically conductive line lead, where the electrically conductive line lead carries a voltage capable of operating an electrical load. The electrical circuit can also include a load circuit portion having a number of unshared resistor pads. The electrical circuit can further include at least one zero ohm resistor electrically coupled to at least one of the shared resistor pads. The at least one zero ohm resistor can be configurable after manufacturing the printed circuit board. The load circuit portion can be electrically isolated from the line circuit portion in the absence of the at least one zero ohm resistor being further electrically coupled to at least one unshared resistor pad of the plurality of unshared resistor pads.

In another aspect, the disclosure can generally relate to a printed circuit board. The printed circuit board can include a first line conductor and a second line conductor. The printed circuit board can also include an electrical circuit having a line circuit portion and a load circuit portion. The line circuit portion of the electrical circuit of the printed circuit board can include a first shared resistor pad electrically coupled to the first line conductor, and a second shared resistor pad electrically coupled to the second line conductor, where the first shared resistor pad and the second shared resistor pad are electrically isolated from each other. The load circuit portion of the electrical circuit of the printed circuit board can include a first load pad and a second load pad, where the first load pad and the second load pad are electrically isolated from each other and are configured to receive an electrical load. The load circuit portion of the electrical circuit of the printed circuit board can also include a first unshared resistor pad electrically coupled to the first load pad, and a second unshared resistor pad electrically coupled to the second load pad. The printed circuit board can also include a first zero ohm resistor having a first end and a second end, where the first end is electrically coupled to the first shared resistor pad. The first zero ohm resistor can be configurable by a user after manufacturing. The load circuit portion can be electrically isolated from the line circuit portion in the absence of the at least one zero ohm resistor being further electrically coupled to at the first unshared resistor pad.

In yet another aspect, the disclosure can generally relate to a method for configuring an electrical circuit on a printed circuit board. The method can include providing the printed circuit board, where the electrical circuit on the printed circuit board includes a load circuit portion and a line circuit portion, where the line circuit portion includes a first shared resistor pad and a second shared resistor pad, and where the load circuit portion comprises a first unshared resistor pad and a second unshared resistor pad. The method can also include electrically coupling, by a user, a first end of a first zero ohm resistor to the first shared resistor pad of a line circuit portion of the electrical circuit on the printed circuit board. The method can further include determining whether to electrically isolate the load circuit portion. The method can also include electrically coupling, by a user when electrically incorporating the load circuit portion into the electrical circuit, a second end of the first zero ohm resistor to the first unshared resistor pad of the load circuit portion, and a second zero ohm resistor to the second unshared resistor pad of the load circuit portion of the electrical circuit and the second shared resistor pad of the line circuit portion of the electrical circuit on the printed circuit board. The method can further include electrically coupling, by a user when electrically isolating the load circuit portion from the line circuit portion, a second end of the first zero ohm resistor to the second shared resistor pad of the line circuit portion. The method can also include providing power to the first shared resistor pad.

These and other aspects, objects, features, and embodiments will be apparent from the following description and the appended claims.

BRIEF DESCRIPTION OF THE DRAWINGS

The drawings illustrate only example embodiments and are therefore not to be considered limiting in scope, as the example embodiments may admit to other equally effective embodiments. The elements and features shown in the drawings are not necessarily to scale, emphasis instead being placed upon clearly illustrating the principles of the example embodiments. Additionally, certain dimensions or positionings may be exaggerated to help visually convey such principles. In the drawings, reference numerals designate like or corresponding, but not necessarily identical, elements.

DETAILED DESCRIPTION

Figure 1A:
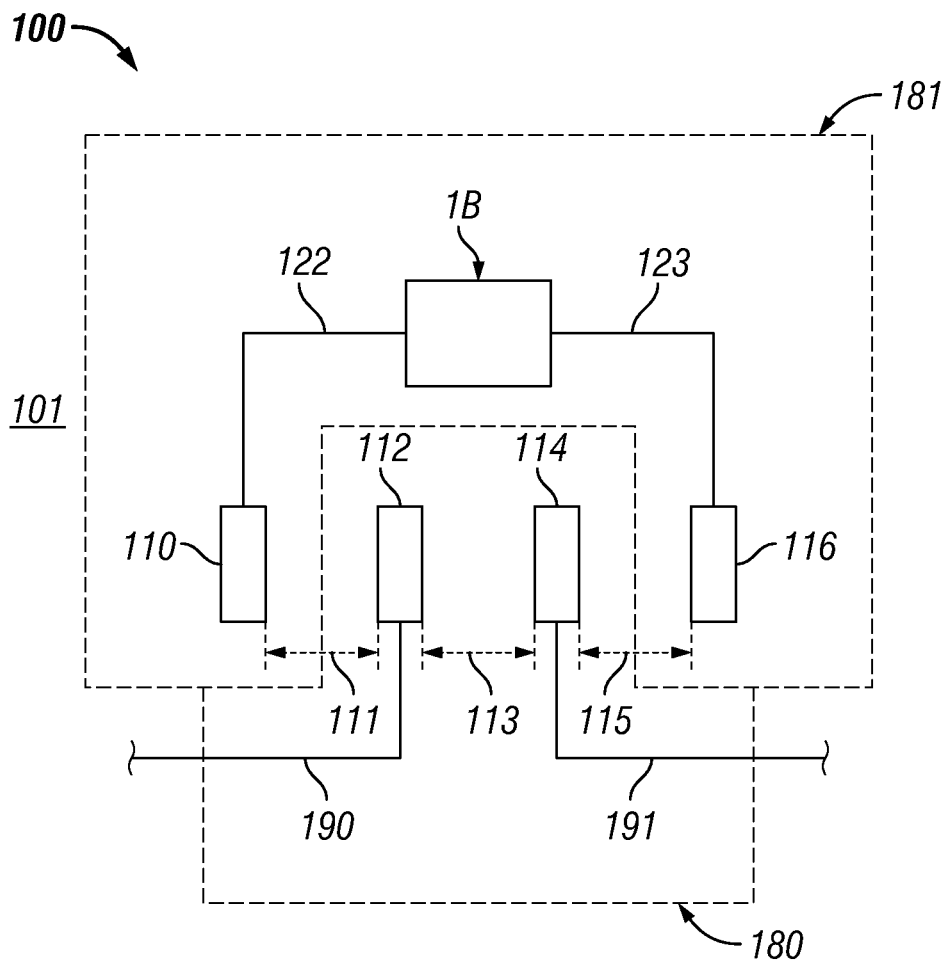
FIGS. 1A and 1B show diagrams of an electrical circuit in accordance with certain example embodiments.

In general, example embodiments provide systems, methods, and devices for shared resistor pad bypass for electrical circuits. Example shared resistor pad bypass for electrical circuits provide a number of benefits. Such benefits can include, but are not limited to, a configurable board that can be used for multiple applications, increased flexibility, improved performance, reduced risk of adverse electrical conditions.

The example embodiments discussed herein can be directed to any type of application (e.g., lighting, a PV solar system, generation control systems, branch circuit management and protection). A user may be any person who interacts with example shared resistor pad bypass for electrical circuits. Examples of a user may include, but are not limited to, an engineer, an electrician, an instrumentation and controls technician, a mechanic, an operator, a consultant, a contractor, and a manufacturer's representative.

Components and/or features described herein can include elements that are described as coupling, electrically coupling, or other similar terms. Such terms are merely meant to indicate that such components of an electrical circuit are connected to each other in such a way as to provide electrical continuity between them. Components and/or features can be electrically coupled to each other directly (e.g., connectors, splicing) or indirectly (e.g., soldering, terminal blocks). As defined herein a pad (e.g., a shared resistor pad, an unshared resistor pad, a load pad) is a location on a printed circuit board where a component (e.g., a zero ohm resistor, an electrical load) can become electrically coupled to an electrical circuit on the printed circuit board.

As defined herein, a printed circuit board is a medium that includes, and on which are disposed, one or more of a number of discrete components (e.g., a diode, a capacitor, a power terminal, a resistor, a light-emitting diode (LED)) and/or one or more integrated circuits that are interconnected with each other by a number of wire traces embedded in the PCB. A printed circuit board (sometimes referred to as a "PCB") can be called one or more of a number of other names, including but not limited to a board, a wiring board, printed wiring board (sometimes referred to as a "PWB"), and a circuit board. A printed circuit board can be removable with respect to, or permanently affixed to, an electrical device. Examples of such an electrical device can include, but are not limited to, a lighting fixture, a display, a computer, a clock, an appliance, a controller, a motor vehicle, a television, and a stereo.

In certain example embodiments, PCBs on which example shared resistor pad bypasses for electrical circuits are disposed are subject to meeting certain standards and/or requirements. For example, the National Electric Code (NEC), Underwriters Laboratories (UL), and the Institute of Electrical and Electronics Engineers (IEEE) set standards as to PCBs, wiring, and electrical connections. Use of example embodiments described herein meet (and/or allow a corresponding device to meet) such standards when required. In some (e.g., PV solar) applications, additional standards particular to that application may be met by the PCBs on which example shared resistor pad bypasses for electrical circuits are disposed.

If a component of a figure is described but not expressly shown or labeled in that figure, the label used for a corresponding component in another figure can be inferred to that component. Conversely, if a component in a figure is labeled but not described, the description for such component can be substantially the same as the description for the corresponding component in another figure. The numbering scheme for the various components in the figures herein is such that each component is a three digit number and corresponding components in other figures have the identical last two digits.

In the foregoing figures showing example embodiments of shared resistor pad bypass for electrical circuits, one or more of the components shown may be omitted, repeated, and/or substituted. Accordingly, example embodiments of shared resistor pad bypass for electrical circuits should not be considered limited to the specific arrangements of components shown in any of the figures. For example, features shown in one or more figures or described with respect to one embodiment can be applied to another embodiment associated with a different figure or description.

Example embodiments of shared resistor pad bypass for electrical circuits will be described more fully hereinafter with reference to the accompanying drawings, in which example embodiments of shared resistor pad bypass for electrical circuits are shown. Shared resistor pad bypass for electrical circuits may, however, be embodied in many different forms and should not be construed as limited to the example embodiments set forth herein. Rather, these example embodiments are provided so that this disclosure will be thorough and complete, and will fully convey the scope of shared resistor pad bypass for electrical circuits to those of ordinary skill in the art. Like, but not necessarily the same, elements (also sometimes called components) in the various figures are denoted by like reference numerals for consistency.

Terms such as "first", "second", and "portion" are used merely to distinguish one component (or part of a component or state of a component) from another. Such terms are not meant to denote a preference or a particular orientation, and are not meant to limit embodiments of shared resistor pad bypass for electrical circuits. In the following detailed description of the example embodiments, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 1B:
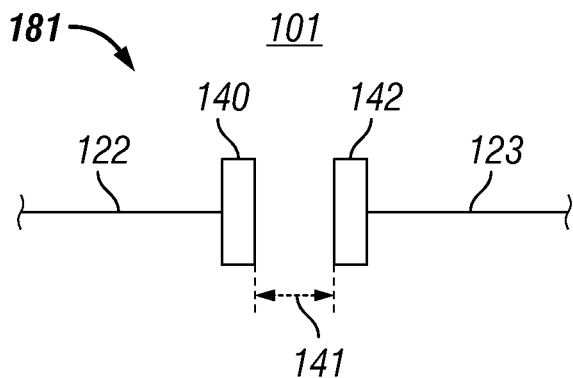

FIGS. 1A and 1B show diagrams of an electrical circuit 100 in accordance with certain example embodiments. Specifically, FIG. 1A shows the electrical circuit 100, and FIG. 1B shows a detailed view of a portion of the electrical circuit 100. The electrical circuit 100 of FIGS. 1A and 1B is shown disposed on a PCB 101. In certain example embodiments, the electrical circuit 100 can have a line circuit portion 180 and a load circuit portion 181. The line circuit portion 180 of the electrical circuit 100 can include one or more components that are configured to receive power and/or control signals from one or more sources, often disposed outside of the electrical circuit 100 shown in FIGS. 1A and 1B. Examples of a source can include, but are not limited to, a battery, a transformer, an inductor, another electrical circuit on the PCB 101, a capacitor, and a controller.

Examples of the components of the line circuit portion 180 of the electrical circuit 100 can include, but are not limited to, a resistor pad and an electrical lead. For example, as shown in FIGS. 1A and 1B, the line circuit portion 180 can include two shared resistor pads (shared resistor pad 112 and shared resistor pad 114) and two electrical leads (electrical lead 190 and electrical lead 191). Each shared resistor pad can be electrically coupled to at least one electrical lead. For example, as shown in FIG. 1A, shared resistor pad 112 can be electrically coupled to electrical lead 190, and shared resistor pad 114 can be electrically coupled to electrical lead 191.

The load circuit portion 181 of the electrical circuit 100 can include one or more components that are configured to receive and use power and/or control signals from the line circuit portion 180 of the electrical circuit 100. Examples of components of the load circuit portion 181 can include, but are not limited to, a light source (e.g., a LED), a resistor pad, a load pad, a capacitor, an inductor, another electrical circuit on the PCB 101, a resistor, and a controller. For example, as shown in FIGS. 1A and 1B, the components of the load circuit portion 181 of the electrical circuit 100 can include two unshared resistor pads (unshared resistor pad 110 and unshared resistor pad 116), two electrical leads (electrical lead 122 and electrical lead 123), and two load pads (load pad 140 and load pad 142).

Each unshared resistor pad can be electrically coupled to at least one electrical lead. For example, as shown in FIG. 1A, shared resistor pad 110 can be electrically coupled to electrical lead 122, and shared resistor pad 116 can be electrically coupled to electrical lead 123. Further, each load pad can be electrically coupled to at least one electrical lead. For example, as shown in FIG. 1B, load pad 140 can be electrically coupled to electrical lead 122, and load pad 142 can be electrically coupled to electrical lead 123. In such a case, shared resistor pad 110 is electrically coupled to load pad 140, and shared resistor pad 116 is electrically coupled to load pad 142.

Figure 2A:
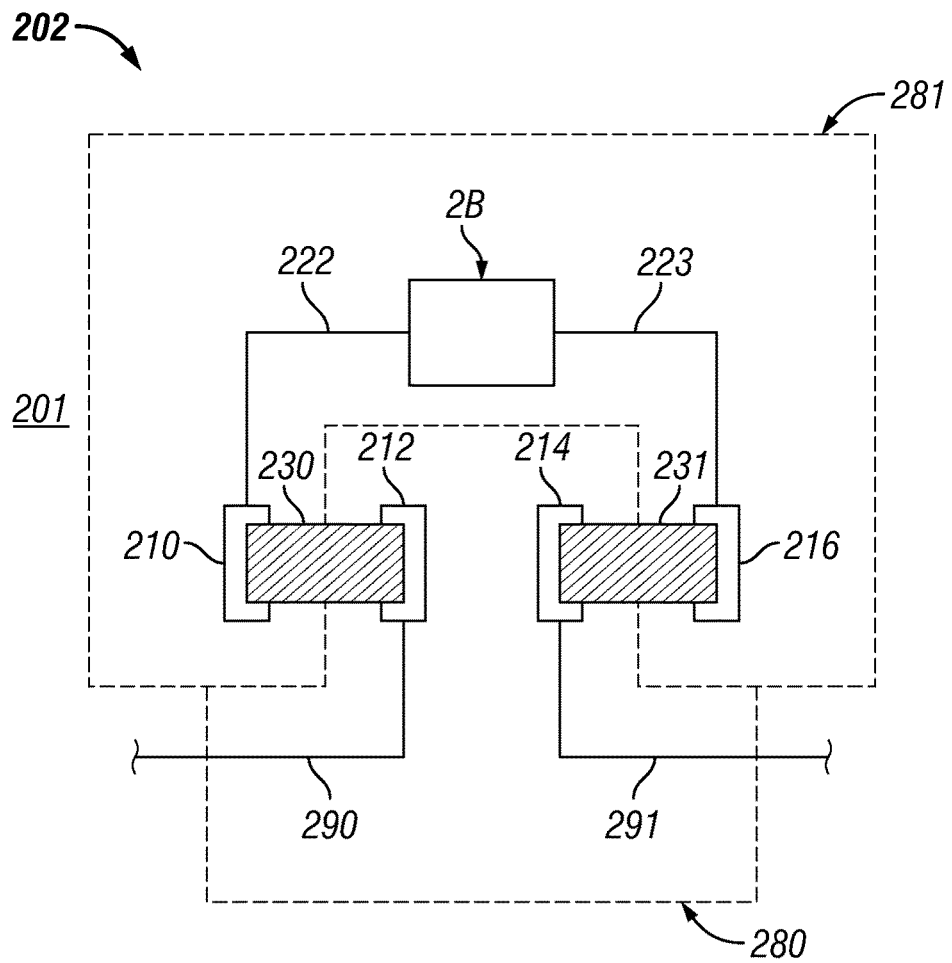
FIGS. 2A and 2B show diagrams of an another electrical circuit in accordance with certain example embodiments.
Figure 2B:
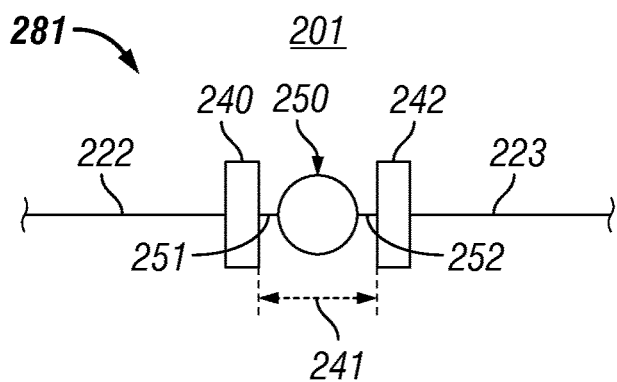
Figure 3A:
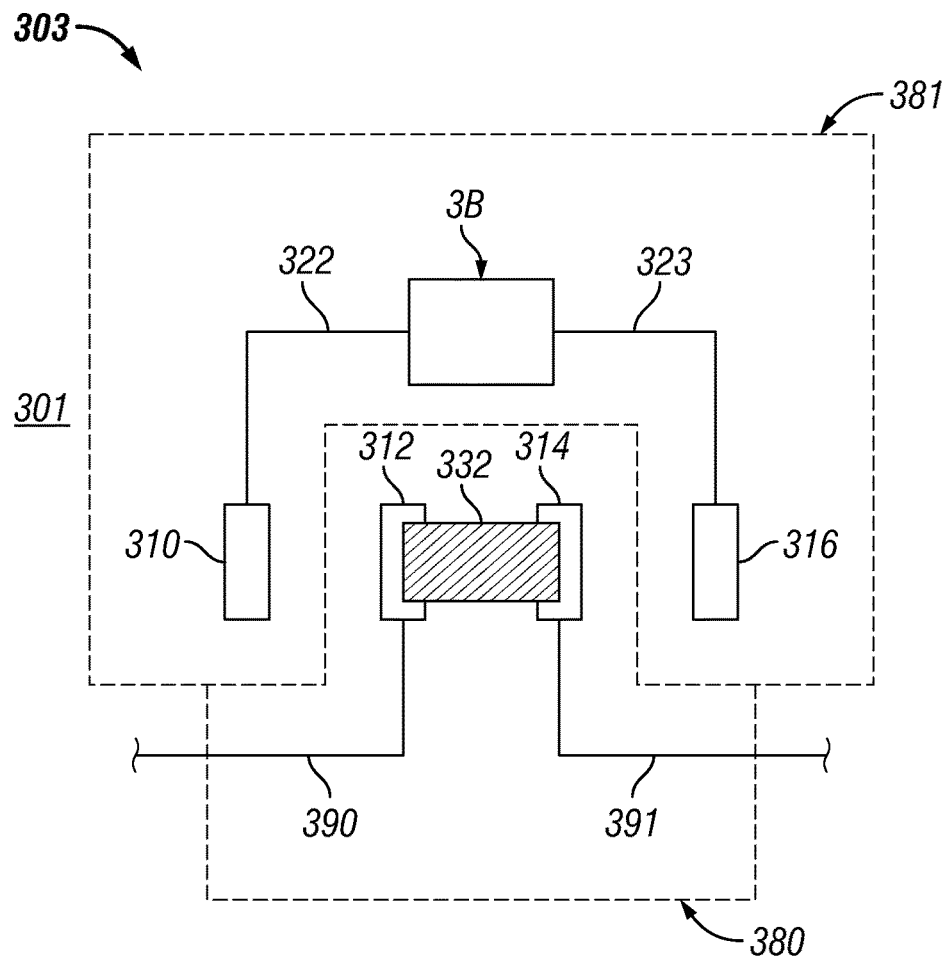
FIGS. 3A and 3B show diagrams of yet another electrical circuit in accordance with certain example embodiments.

The resistor pads of the line circuit portion 180 are called shared resistor pads because, as shown in FIGS. 2A and 3A below, a zero ohm resistor (described below) coupled to each such shared resistor pad can have at least two configurations with respect to the electrical circuit 100. The unshared resistor pads of the load circuit portion 181 are called such because a zero ohm resistor, when electrically coupled to the unshared resistor pad, only has one orientation, as shown in FIGS. 2A and 2B below. The load pads of the load circuit portion 181 are so named because each load pad, as shown in FIG. 2B below, is configured to receive a portion of an electrical load.

The shared resistor pads (in this case, shared resistor pad 112 and shared resistor pad 114) of the line circuit portion 180 of the electrical circuit 100 can be oriented in any of a number of ways with respect to each other and with respect to the unshared resistor pads (in this case, unshared resistor pad 110 and unshared resistor pad 116) of the load circuit portion 181 of the electrical circuit 100. Similarly, the unshared resistor pads of the load circuit portion 181 of the electrical circuit 100 can be oriented in any of a number of ways with respect to each other and with respect to the shared resistor pads of the line circuit portion 180 of the electrical circuit 100.

In this example, as shown in FIG. 1A, the shared resistor pads and the unshared resistor pads are aligned in a single row in a left to right order of unshared resistor pad 110, shared resistor pad 112, shared resistor pad 114, and unshared resistor pad 116. A resistor pad can be separated from an adjacent resistor pad by a distance. For example, as shown in FIG. 1A, unshared resistor pad 110 can be separated from shared resistor pad 112 by distance 111, shared resistor pad 112 can be separated from shared resistor pad 114 by distance 113, and shared resistor pad 114 can be separated from unshared resistor pad 116 by distance 115. In some cases each distance (distance 111, distance 113, distance 115) can be at least some minimum distance (e.g., 1.75 millimeters) under conditions of the electrical circuit 100 in order to meet one or more applicable standards and/or requirements (e.g., UL Class 1 requirements).

Similarly, the load pads (in this case, load pad 140 and load pad 142) of the load circuit portion 181 of the electrical circuit 100 can be oriented in any of a number of ways with respect to each other. In this example, as shown in FIG. 1B, load pads are aligned in a single row in a left to right order of load pad 140 and load pad 142. A load pad can be separated from an adjacent load pad by a distance. For example, as shown in FIG. 1B, load pad 140 can be separated from load pad 142 by distance 141. In some cases, the distance 141 can be less than some distance (e.g., 0.25 millimeters), falling outside one or more applicable standards and/or requirements (e.g., UL Class 1 requirements).

In the electrical circuit 100 of FIGS. 1A and 1B, there are no zero ohm resistors. As a result, the load circuit portion 181 is not electrically coupled to the load circuit portion 180 of the electrical circuit 100. Specifically, the unshared resistor pad 110 and the shared resistor pad 112 are not electrically coupled, and the unshared resistor pad 116 and the shared resistor pad 114 are not electrically coupled. As a result, the load circuit portion 181 of FIGS. 1A and 1B is electrically isolated from the line circuit portion 180 of the electrical circuit 100, as well as from the rest of the circuitry on the PCB 101.

Further, there is no load electrically coupled to the load pad 140 and the load pad 142 of the load circuit portion 181. As a result, the load pad 140 and the load pad 142 are not electrically coupled to each other. Consequently, unshared resistor pad 110, electrical lead 122, and load pad 140 of the load circuit portion 181 of FIGS. 1A and 1B are electrically isolated from unshared resistor pad 116, electrical lead 123, and load pad 142 of the load circuit portion 181. Under current embodiments known in the art, the load circuit portion 181 is electrically coupled to the line circuit portion 180 at all times. As a result, in the absence of an electrical load coupled to the load pads and in the presence of power flowing through a portion of the load circuit portion 181, the distance 141 between load pad 140 and load pad 142 can be so small as to induce dielectric breakdown between the load pads.

The electrical leads of FIGS. 1A and 1B (in this case, electrical lead 190, electrical lead 191, electrical lead 122, and electrical lead 123) can be made of electrically conductive material (e.g., copper, aluminum) so that electrical power (e.g., current) can travel along such electrical leads. The electrical leads can be called by any of a number of other names, including but not limited to line conductors, leads, and traces. Each of the electrical leads can embedded within the board or disposed on an outer surface (e.g., top surface, bottom surface) of the PCB 101.

FIGS. 2A and 2B show diagrams of an another electrical circuit 202 in accordance with certain example embodiments. Specifically, FIG. 2A shows the electrical circuit 202, and FIG. 2B shows a detailed view of a portion of the electrical circuit 202. The electrical circuit 202 (including components thereof) of FIGS. 2A and 2B are substantially the same as the electrical circuit 100 (including corresponding components thereof) of FIGS. 1A and 1B, except as described below. For example, load pad 240 can be separated from load pad 242 by distance 241.

Referring to FIGS. 1A-2B, an electrical load 250 is included in the load circuit portion 281 of the electrical circuit 202. The electrical load 250 can be any one or more components of the load circuit portion 281 that operates using the power and/or control signals delivered to the load circuit portion 281 by the line circuit portion 280. Examples of an electrical load 250 can include, but are not limited to, a light source, a controller, a sensor, another electrical circuit (which may be similar to, or different than, electrical circuit 202), and a measuring device. In this example, the electrical load 250 is a LED. The electrical load 250 can be electrically coupled to two or more of the load pads of the load circuit portion 281 using electrical conductors (e.g., wires).

In this case, the electrical load 250 has two electrical conductors (electrical conductor 251 and electrical conductor 252), where one electrical conductor (electrical conductor 251) is electrically coupled to load pad 240, and where the other electrical conductor (electrical conductor 252) is electrically coupled to load pad 242. With the inclusion of the electrical load 250, the load circuit portion 281 is electrically continuous between the unshared resistor pad 210 and the unshared resistor pad 216.

In addition, rather than being electrically isolated from the line circuit portion (as shown above with respect to FIG. 1A), the load circuit portion 281 is electrically coupled to the line circuit portion 280 of FIG. 2A. To achieve this in this example, two zero ohm resistors (zero ohm resistor 230 and zero ohm resistor 231) are included in the electrical circuit 202. For zero ohm resistor 230, one end of the zero ohm resistor 230 is electrically coupled to the shared resistor pad 212, and the other end of the zero ohm resistor 230 is electrically coupled to the unshared resistor pad 210. For zero ohm resistor 231, one end of the zero ohm resistor 231 is electrically coupled to the shared resistor pad 214, and the other end of the zero ohm resistor 231 is electrically coupled to the unshared resistor pad 216.

As a result, electrical circuit 202 is electrically continuous. For example, if power flows along electrical lead 290 to shared resistor pad 212, the power continues to flow through the zero ohm resistor 230 to the unshared resistor pad 210 of the load circuit portion 281, to the electrical lead 222 to the load pad 240 to electrical conductor 251 to the electrical load 250 to electrical conductor 252 to load pad 242 to electrical lead 223 to unshared resistor pad 216, then through zero ohm resistor 231 to the shared resistor pad 214 to the electrical lead 291 of the line circuit portion 280.

In certain example embodiments, a zero ohm resistor is a resistor that has very low (a few ohms or less) resistance from one end of the resistor to the other while allowing power to flow from one end of the resistor to the other end. A zero ohm resistor can be a jumper, a wire, a bar, an actual resistor, or any other suitable form. Each end of the zero ohm resistor is configured to electrically couple to one or more shared resistor pads and/or an unshared resistor pad. The zero ohm resistor has sufficient thickness and is made of such material as to withstand the amount of power that can flow through such resistor and the amount of time that the power can flow through such resistor.

Figure 3B:
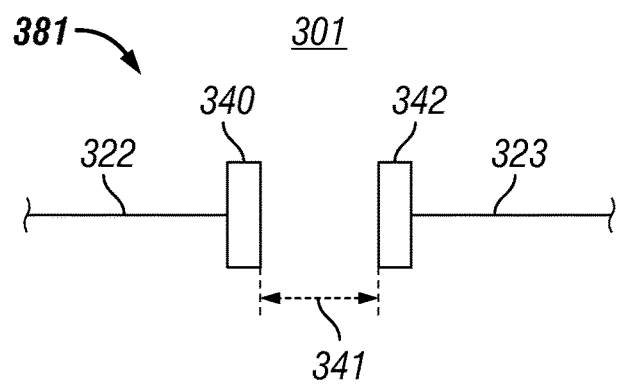

FIGS. 3A and 3B show diagrams of yet another electrical circuit 303 in accordance with certain example embodiments. Specifically, FIG. 3A shows the electrical circuit 303, and FIG. 3B shows a detailed view of a portion of the electrical circuit 303. The electrical circuit 303 (including components thereof) of FIGS. 3A and 3B are substantially the same as the electrical circuit 100 (including corresponding components thereof) of FIGS. 1A and 1B, except as described below. For example, the electrical circuit 303 of FIGS. 3A and 3B is shown disposed on a PCB 301.

Referring to FIGS. 1A-3B, the load circuit portion 381 is without an electrical load. Specifically, there is no electrical load electrically coupled to the load pad 340 and the load pad 342 of the load circuit portion 381. In this way, the load circuit portion 381 of FIGS. 3A and 3B is configured substantially similar to the load circuit portion 181 of FIGS. 1A and 1B. As a result, the load pad 340 and the load pad 342 are not electrically coupled to each other. Consequently, unshared resistor pad 310, electrical lead 322, and load pad 340 of the load circuit portion 381 of FIGS. 3A and 3B are electrically isolated from unshared resistor pad 316, electrical lead 323, and load pad 342 of the load circuit portion 381.

Also, unlike current embodiments known in the art, the load circuit portion 381 is electrically isolated from the line circuit portion 380. Specifically, the configuration of zero ohm resistors shown above with respect to FIG. 2A has been altered in the electrical circuit 303 of FIG. 3A. Rather than having zero ohm resistor 230 electrically coupled to the shared resistor pad 212, and the unshared resistor pad 210 and having zero ohm resistor 231 electrically coupled to the shared resistor pad 214, and the unshared resistor pad 216, as with the electrical circuit 202 of FIG. 2A, the electrical circuit 303 of FIG. 3A has no zero ohm resistors between shared resistor pad 212, and unshared resistor pad 210 or between shared resistor pad 214, and unshared resistor pad 216.

Instead, the electrical circuit 303 of FIG. 3A uses a single zero ohm resistor 332. In this case, one end of the zero ohm resistor 332 is electrically coupled to shared resistor pad 312, and the other end of the zero ohm resistor 332 is electrically coupled to shared resistor pad 314. In this way, the line circuit portion 380 of the electrical circuit 303 is electrically continuous. Thus, if power flows along electrical lead 390 to shared resistor pad 312, the power continues to flow through the zero ohm resistor 332 to the shared resistor pad 314 and along the electrical lead 391 of the line circuit portion 280.

Further, the load circuit portion 381 is electrically isolated from the line circuit portion 380. In this way, unshared resistor pad 310 and unshared resistor pad 316 have substantially zero voltage potential when power is provided to the shared resistor pad 312. As a result, in the absence of an electrical load coupled to load pad 340 and load pad 342 and in the presence of power flowing through the line circuit portion 380, there is no risk of dielectric breakdown between load pad 340 and load pad 342, regardless of how small the distance 341 between load pad 340 and load pad 342 is. Also, a user that contacts any portion of the load circuit portion 381 when power flows through the line circuit portion 380 of FIGS. 3A and 3B can do so without the risk of electrical shock or other similar harms.

Figure 4:
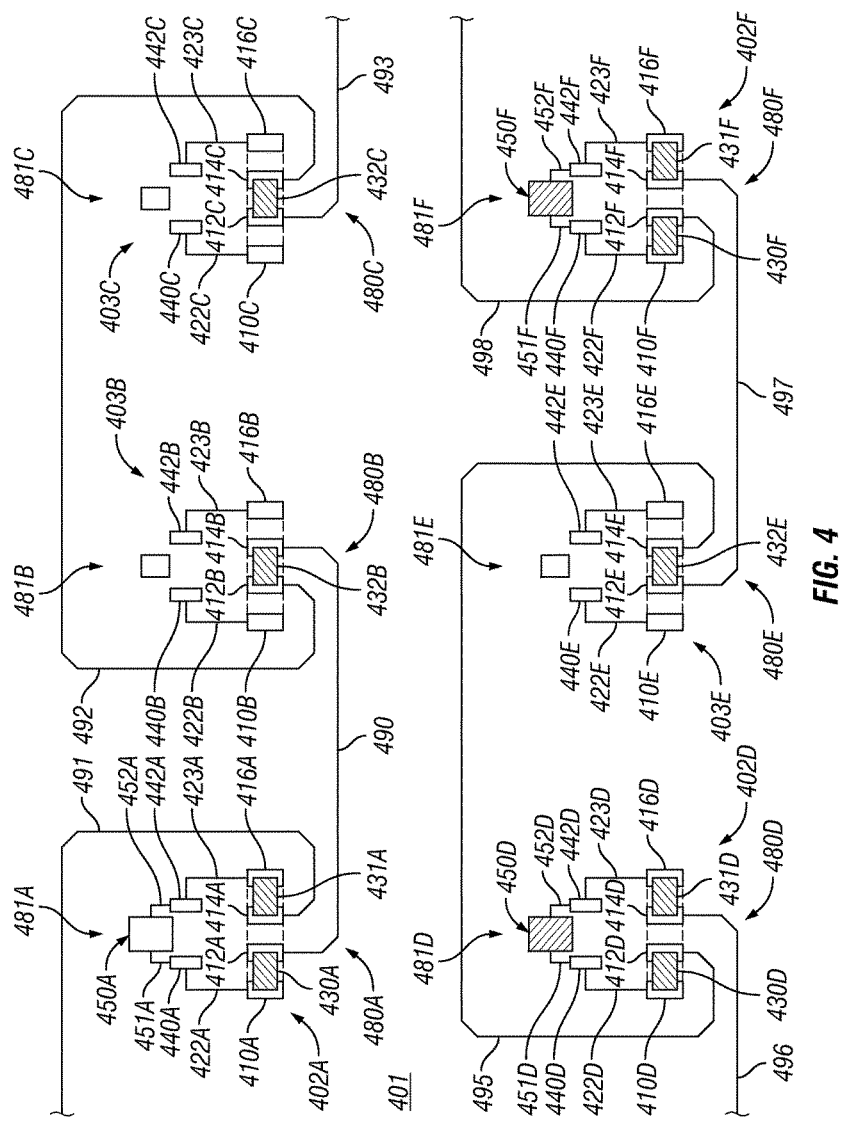
FIG. 4 shows a circuit board having multiple electrical circuits in accordance with certain example embodiments.

FIG. 4 shows a portion of a circuit board 401 having multiple electrical circuits in accordance with certain example embodiments. Specifically, FIG. 4 shows six electrical circuits: electrical circuit 402A, 403B, 403C, 402D, 403E, and 402F. Referring to FIGS. 1A-4, electrical circuit 402A, electrical circuit 402D, and electrical circuit 402F of FIG. 4 are substantially similar to FIG. 202 of FIGS. 2A and 2B, except as described below. In addition, electrical circuit 403B, electrical circuit 403C, and electrical circuit 403E of FIG. 4 are substantially similar to FIG. 303 of FIGS. 3A and 3B, except as described below. For example, electrical circuit 402A can include resistor pad 410A coupled to load pad 440A using electrical load 422A, where load pad 440A is coupled to electrical load 450A using electrical conductor 451A, where electrical load 450A is coupled to load pad 442A using electrical conductor 452A, where load pad 442A is coupled to resistor pad 416A using electrical load 423A. As another example, electrical circuit 402B can include resistor pad 410B coupled to load pad 440B using electrical load 422B, and resistor pad 416B coupled to load pad 442B using electrical load 423B. As yet another example, electrical circuit 402C can include resistor pad 410C coupled to load pad 440C using electrical load 422C, and resistor pad 416C coupled to load pad 442C using electrical load 423C. As still another example, electrical circuit 402D can include resistor pad 410D coupled to load pad 440D using electrical load 422D, where load pad 440D is coupled to electrical load 450D using electrical conductor 451D, where electrical load 450D is coupled to load pad 442D using electrical conductor 452D, where load pad 442D is coupled to resistor pad 416D using electrical load 423D. As yet another example, electrical circuit 402E can include resistor pad 410E coupled to load pad 440E using electrical load 422E, and resistor pad 416E coupled to load pad 442E using electrical load 423E. As still another example, electrical circuit 402F can include resistor pad 410F coupled to load pad 440F using electrical load 422F, where load pad 440F is coupled to electrical load 450F using electrical conductor 451F, where electrical load 450F is coupled to load pad 442F using electrical conductor 452F, and where load pad 442F is coupled to resistor pad 416F using electrical load 423F.

Thus, as with the load circuit portion 281 of the electrical circuit 202 of FIGS. 2A and 2B, the load circuit portion 481A of the electrical circuit 402A, the load circuit portion 481D of the electrical circuit 402D, and the load circuit portion 481F of the electrical circuit 402F are electrically coupled to the line circuit portion 480A, the line circuit portion 480D, the line circuit portion 480F, respectively. Thus, each of electrical circuit 402A (using zero ohm resistor 430A to electrically couple shared resistor pad 412A and unshared resistor pad 410A, and resistor pad 431A to electrically couple shared resistor pad 414A and unshared resistor pad 416A), electrical circuit 402D (using zero ohm resistor 430D to electrically couple shared resistor pad 412D and unshared resistor pad 410D, and resistor pad 431D to electrically couple shared resistor pad 414D and unshared resistor pad 416D), and electrical circuit 402F (using zero ohm resistor 430F to electrically couple shared resistor pad 412F and unshared resistor pad 410F, and resistor pad 431F to electrically couple shared resistor pad 414F and unshared resistor pad 416F) are configured, to deliver power to electrical load 450A, electrical load 450D, and electrical load 450F, respectively, from the corresponding line circuit portion.

Similarly, as with the load circuit portion 381 of the electrical circuit 303 of FIGS. 3A and 3B, the load circuit portion 481B (based on zero ohm resistor 432B being electrically coupled to shared resistor pad 412B and shared resistor pad 414B and no zero ohm resistors electrically coupled to unshared resistor pad 410B or unshared resistor pad 416B) of the electrical circuit 403B, the load circuit portion 481C (based on zero ohm resistor 432C being electrically coupled to shared resistor pad 412C and shared resistor pad 414C and no zero ohm resistors electrically coupled to unshared resistor pad 410C or unshared resistor pad 416C) of the electrical circuit 403C, and the load circuit portion 481E (based on zero ohm resistor 432E being electrically coupled to shared resistor pad 412E and shared resistor pad 414E and no zero ohm resistors electrically coupled to unshared resistor pad 410E or unshared resistor pad 416E) of the electrical circuit 403D are electrically isolated from the line circuit portion 480B, the line circuit portion 480C, the line circuit portion 480E, respectively.

Thus, regardless of the distance 441B between load pad 440B and load pad 442B of load circuit portion 403B, the distance 441C between load pad 440C and load pad 442C of load circuit portion 403C, and the distance 441E between load pad 440E and load pad 442E of load circuit portion 403E, the risk of dielectric breakdown between each of those pairs of load pads is greatly reduced, if not eliminated.

Also, in this case, one or more electrical leads for a line circuit portion can be shared with one or more other electrical lead for one or more line circuit portions. For example, as shown in FIG. 4, one end of electrical lead 490 is coupled to shared resistor pad 412A of electrical circuit 402A, and the other end of electrical lead 490 is coupled to shared resistor pad 414B of electrical circuit 403B. As another example, one end of electrical lead 492 of FIG. 4 is coupled to shared resistor pad 412B of electrical circuit 403B, and the other end of electrical lead 492 is coupled to shared resistor pad 414C of electrical circuit 402C.

As a further example, one end of electrical lead 495 of FIG. 4 is coupled to shared resistor pad 412D of electrical circuit 402D, and the other end of electrical lead 495 is coupled to shared resistor pad 414E of electrical circuit 403E. As a final example, one end of electrical lead 497 of FIG. 4 is coupled to shared resistor pad 412E of electrical circuit 403E, and the other end of electrical lead 497 is coupled to shared resistor pad 414F of electrical circuit 402F. Electrical lead 491, coupled to resistor pad 414A of electrical circuit 402A, is continued from some other device (e.g., a power source) and/or circuit (e.g., another electrical circuit). Further, electrical lead 493, coupled to resistor pad 412C of electrical circuit 402C, continues to some other device and/or circuit. In addition, electrical lead 496, coupled to resistor pad 414D of electrical circuit 402D, is continued from some other device and/or circuit. Similarly, electrical lead 498, coupled to resistor pad 412F of electrical circuit 402F, continues to some other device and/or circuit.

Figure 5:
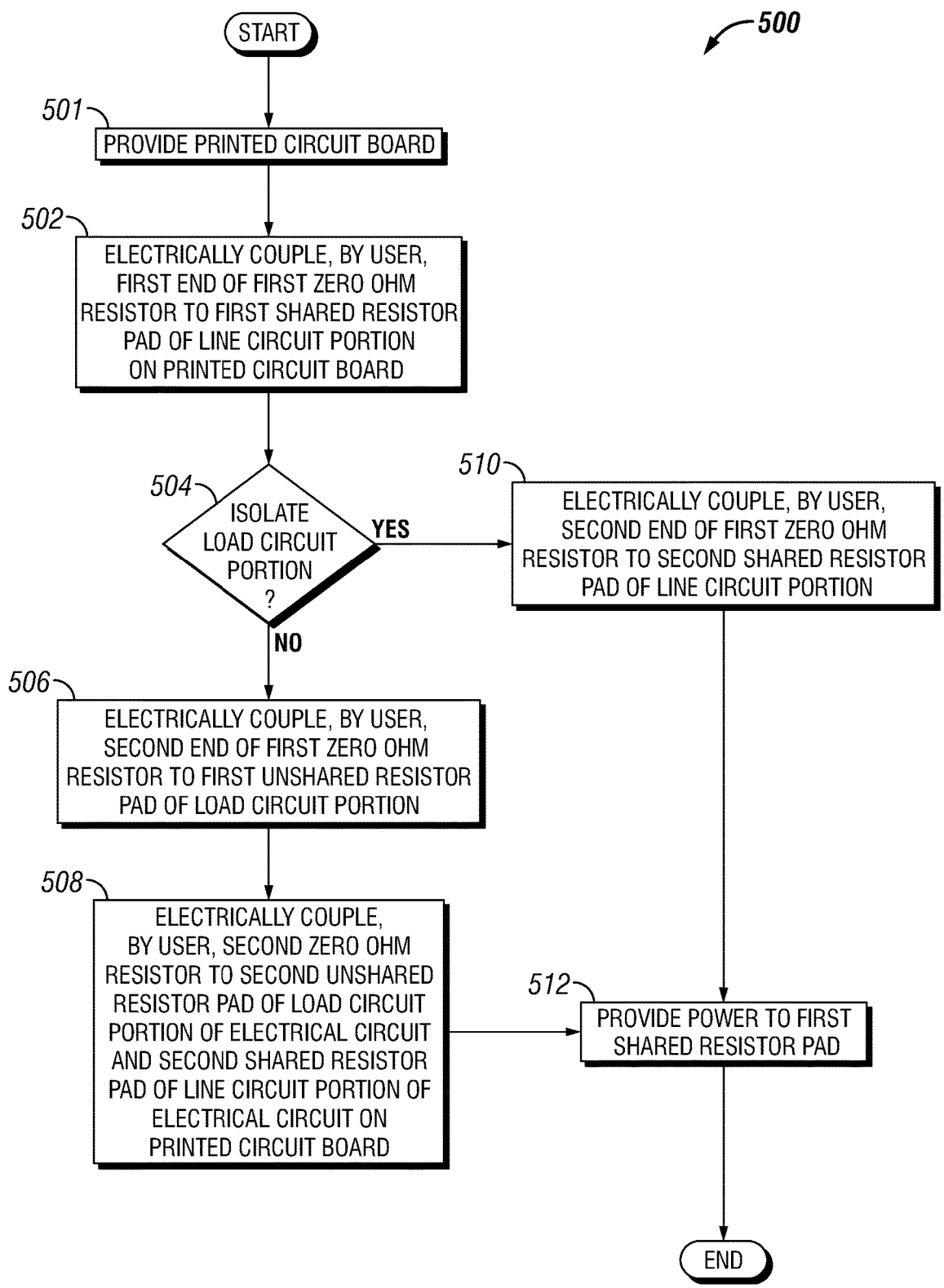
FIG. 5 shows a flowchart of a method for providing power to an electrical circuit on a printed circuit board in accordance with certain example embodiments.

FIG. 5 shows a flowchart of a method 500 for providing power to an electrical circuit on a printed circuit board. While the various steps in this flowchart are presented and described sequentially, one of ordinary skill will appreciate that some or all of the steps may be executed in different orders, may be combined or omitted, and some or all of the steps may be executed in parallel. Further, in one or more of the example embodiments, one or more of the steps described below may be omitted, repeated, and/or performed in a different order. In addition, a person of ordinary skill in the art will appreciate that additional steps not shown in FIG. 5, may be included in performing this method. Accordingly, the specific arrangement of steps should not be construed as limiting the scope.

Referring now to FIGS. 1A-5, the example method 500 begins at the START step and proceeds to step 501, where a printed circuit board 201 is provided. The printed circuit board 201 has an electrical circuit 202. The electrical circuit 202 on the printed circuit board 201 can include a load circuit portion 281 and a line circuit portion 280. In such a case, the line circuit portion 280 can include a first shared resistor pad 212 and a second shared resistor pad 214. In addition, the load circuit portion 281 can include a first unshared resistor pad 210 and a second unshared resistor pad 216. In certain example embodiments, the printed circuit board 201 is provided to a user after the printed circuit board 201 has been manufactured.

In step 502, a first end of a zero ohm resistor 230 is electrically coupled to the shared resistor pad 212 of the line circuit portion 280 of the electrical circuit 202 on the printed circuit board 201. In certain example embodiments, the first end of the zero ohm resistor 230 is electrically coupled to the shared resistor pad 212 by a user using soldering, terminating, snap fitting, or any other electrical coupling means.

In step 504, a determination is made as to whether the load circuit portion 281 should be electrically isolated. Electrical isolation can be with respect to the line circuit portion 280. If the load circuit portion 281 should be electrically isolated, then the process proceeds to step 510. If the load circuit portion 281 should not be electrically isolated (in other words, if the load circuit portion 281 should be incorporated into or electrically coupled to the line circuit portion 280), then the process proceeds to step 506.

In step 506, a second end of a zero ohm resistor 230 is electrically coupled to the unshared resistor pad 210 of the load circuit portion 281 of the electrical circuit 202 on the printed circuit board 201. In certain example embodiments, the second end of the zero ohm resistor 230 is electrically coupled to the unshared resistor pad 210 by a user using soldering, terminating, snap fitting, or any other electrical coupling means.

In step 508, another zero ohm resistor 231 is electrically coupled to the unshared resistor pad 216 of the load circuit portion 281 of the electrical circuit 202 and the shared resistor pad 214 of the line circuit portion 280 of the electrical circuit 202 on the printed circuit board 201. In certain example embodiments, the zero ohm resistor 231 is electrically coupled to the unshared resistor pad 216 and the shared resistor pad 214 by a user using soldering, terminating, snap fitting, or any other electrical coupling means. The load circuit portion 281 can include an electrical load 250. In such a case, the electrical load 250 can be electrically coupled to load pad 240 (which, in turn, is electrically coupled to unshared resistor pad 210) and load pad 242 (which, in turn, is electrically coupled to unshared resistor pad 216). When step 508 is complete, the process proceeds to step 512.

In step 510, the second end of the zero ohm resistor 230 is electrically coupled to the shared resistor pad 214 of the line circuit portion 280 of the electrical circuit 202 on the printed circuit board 201. In certain example embodiments, the second end of the zero ohm resistor 230 is electrically coupled to the shared resistor pad 214 by a user using soldering, terminating, snap fitting, or any other electrical coupling means.

In step 512, power is provided to a shared resistor pad (e.g., shared resistor pad 212). The power can include power and/or control signals. The line circuit portion 280 can have the control and/or power signals flowing on one or more electrical leads (e.g., electrical lead 290, electrical lead 291) that are electrically coupled to shared resistor pad 212 and shared resistor pad 214. When the load circuit portion 281 is electrically isolated from the line circuit portion 280, the load circuit portion 281 does not receive any of the power delivered to shared resistor pad 212. Instead, the power delivered to the shared resistor pad 212 flows through the zero ohm resistor 230 to shared resistor pad 214 and on to another electrical circuit that is electrically coupled to the line circuit portion 280 of the electrical circuit 202.

Alternatively, when the load circuit portion 281 is incorporated into (electrically coupled to) the line circuit portion 280, the power provided to the shared resistor pad 212 is also provided to the electrical load 250 through the zero ohm resistor 230, the unshared resistor pad 210, electrical lead 222, and load pad 240 to reach the electrical load 250. Further, once the electrical load 250 receives the power, the power is returned to the shared resistor pad 214 through the load pad 242, electrical lead 223, unshared resistor pad 216, and zero ohm resistor 231. When step 512 is complete, the process can proceed to the END step.

In certain example embodiments, a user can reconfigure the electrical circuit 202. To reconfigure the electrical circuit 202, the user can terminate the flow of power to a load circuit portion 281 (and, more specifically, to the shared resistor pad 212 and/or the shared resistor pad 214) of the electrical circuit 202. Once the power has been terminated, if the electrical circuit 202 is being reconfigured to electrically isolate the load circuit portion 281, the zero ohm resistor 230 is removed from the unshared resistor pad 210 of the load circuit portion 281 of the electrical circuit 202 and the shared resistor pad 212 of the line circuit portion 280 of the electrical circuit 202 on the printed circuit board 201. In addition, zero ohm resistor 231 is removed from the unshared resistor pad 216 of the load circuit portion 281 of the electrical circuit 202 and the shared resistor pad 214 of the line circuit portion 280 of the electrical circuit 202 on the printed circuit board 201.

Once zero ohm resistor 230 and zero ohm resistor 231 are removed, zero ohm resistor 230, zero ohm resistor 231, or another zero ohm resistor (e.g., zero ohm resistor 232) can be electrically coupled to the shared resistor pad 212 and the shared resistor pad 214. When this occurs, the load circuit portion 281 of the electrical circuit 202 is electrically bypassed (isolated). Thus, when power is again provided to the shared resistor pad 212, there is no (zero) voltage potential across the load circuit portion 281.

Alternatively, once the power has been terminated, if the electrical circuit 202 is being reconfigured to electrically incorporate the load circuit portion 281, the zero ohm resistor 230 is removed from the shared resistor pad 212 and the shared resistor pad 214 of the line circuit portion 280 of the electrical circuit 202 on the printed circuit board 201. Once zero ohm resistor 230 is removed, zero ohm resistor 230, zero ohm resistor 231, or another zero ohm resistor (e.g., zero ohm resistor 232) can be electrically coupled to the unshared resistor pad 210 of the load circuit portion 281 and the shared resistor pad 212 of the line circuit portion 212. In addition, a zero ohm resistor different from the zero ohm resistor that is electrically coupled to the unshared resistor pad 210 and the shared resistor pad 212 (e.g., zero ohm resistor 230, zero ohm resistor 231, zero ohm resistor 232) can be electrically coupled to the unshared resistor pad 216 of the load circuit portion 281 and the shared resistor pad 214 of the line circuit portion 212. When these two zero ohm resistors are electrically coupled to the electrical circuit 202, the load circuit portion 281 of the electrical circuit 202 is electrically incorporated with (coupled to) the line circuit portion 280. Thus, when power is again provided to the shared resistor pad 212, the power flows through a zero ohm resistor to the electrical load 250 of the load circuit portion 281 and returns to the line circuit portion 280 through the other zero ohm resistor.

Example embodiments provide for shared resistor pad bypass for electrical circuits. Specifically, certain example embodiments allow for a user-configurable electrical circuit where one or more zero ohm resistors can be used to electrically isolate a load circuit portion of the electrical circuit from a line circuit portion. Alternatively, a user can configure one or more zero ohm resistors to electrically couple a load circuit portion of the electrical circuit from a line circuit portion. Example shared resistor pad bypass for electrical circuits can be used to prevent dielectric breakdown of some or all of the load circuit portion of an electrical circuit. Example embodiments can allow an electrical circuit to comply with applicable standards (e.g., UL Class 1, UL Class 2) and/or regulations. Example embodiments allow for the manufacture of a single design of printed circuit board that can be configured (and even subsequently reconfigured) by a user after the printed circuit board is manufactured so that some or all of the printed circuit board can be configured for a particular application.

Although embodiments described herein are made with reference to example embodiments, it should be appreciated by those skilled in the art that various modifications are well within the scope and spirit of this disclosure. Those skilled in the art will appreciate that the example embodiments described herein are not limited to any specifically discussed application and that the embodiments described herein are illustrative and not restrictive. From the description of the example embodiments, equivalents of the elements shown therein will suggest themselves to those skilled in the art, and ways of constructing other embodiments using the present disclosure will suggest themselves to practitioners of the art. Therefore, the scope of the example embodiments is not limited herein.

What is claimed is:

1. An electrical circuit on a printed circuit board, the electrical circuit comprising:
   a line circuit portion comprising a plurality of shared resistor pads, wherein each shared resistor pad of the plurality of shared resistor pads is electrically coupled to an electrically conductive line lead, wherein the electrically conductive line lead carries a voltage capable of operating an electrical load;
   a load circuit portion comprising a plurality of unshared resistor pads; and
   at least one zero ohm resistor electrically coupled to at least one shared resistor pad of the plurality of shared resistor pads,
   wherein the at least one zero ohm resistor is configurable after manufacturing the printed circuit board, and
   wherein the load circuit portion is electrically isolated from the line circuit portion in the absence of the at least one zero ohm resistor being further electrically coupled to at least one unshared resistor pad of the plurality of unshared resistor pads.

2. The electrical circuit of claim 1, wherein the plurality of shared resistor pads comprises a first shared resistor pad and a second shared resistor pad.

3. The electrical circuit of claim 2, wherein the first shared resistor pad is adjacent to the second shared resistor pad.

4. The electrical circuit of claim 3, wherein the first shared resistor pad and the second shared resistor pad are separated by a distance that is at least equal to Underwriters Laboratories requirements for a Class 1 circuit.

5. The electrical circuit of claim 3, wherein the at least one zero ohm resistor is a single zero ohm resistor, wherein the single zero ohm resistor is electrically coupled to the first and second shared resistor pads, and wherein the load circuit portion is electrically isolated from a remainder of the printed circuit board.

6. The electrical circuit of claim 5, wherein the plurality of unshared resistor pads comprises a first unshared resistor pad and a second unshared resistor pad, wherein the first unshared resistor pad and the second unshared resistor pad have substantially zero voltage potential when power is provided to the first shared resistor pad.

7. The electrical circuit of claim 5, wherein the load circuit portion further comprises a first load pad electrically coupled to the first unshared resistor pad and a second load pad electrically coupled to the second unshared resistor pad, wherein the first load pad and the second load pad are configured to receive the electrical load, wherein the electrical load is absent from the load circuit portion.

8. The electrical circuit of claim 7, wherein the first load pad and the second load pad are separated by a distance that is less than Underwriters Laboratories requirements for a Class 1 circuit.

9. The electrical circuit of claim 5, wherein the single zero ohm resistor is soldered to the first and second shared resistor pads by a user.

10. The electrical circuit of claim 2, wherein the plurality of unshared resistor pads comprises a first unshared resistor pad and a second unshared resistor pad, wherein the at least one zero ohm resistor comprises a first zero ohm resistor and a second zero ohm resistor, wherein the first zero ohm resistor is electrically coupled to the first shared resistor pad and the first unshared resistor pad, and wherein the second zero ohm resistor is electrically coupled to the second shared resistor pad and the second unshared resistor pad.

11. The electrical circuit of claim 10, wherein the load circuit portion further comprises a first load pad electrically coupled to the first unshared resistor pad, a second load pad electrically coupled to the second unshared resistor pad, and the electrical load electrically coupled to the first load pad and the second load pad.

12. The electrical circuit of claim 11, wherein the electrical load comprises a light-emitting diode.

13. The electrical circuit of claim 11, wherein the electrical load comprises an additional plurality of shared resistor pads, an additional plurality of unshared resistor pads, at least one additional zero ohm resistor, and an additional load.

14. The electrical circuit of claim 10, wherein the first unshared resistor pad is positioned adjacent to the first shared resistor pad, and wherein the second unshared resistor pad is positioned adjacent to the second shared resistor pad.

15. The electrical circuit of claim 14, wherein the first unshared resistor pad and the first shared resistor pad are separated by a distance that is compliant with a Class 1 classification for electrical circuits.

16. A printed circuit board comprising:
   a first line conductor and a second line conductor;
   an electrical circuit comprising:
      a line circuit portion comprising:
         a first shared resistor pad electrically coupled to the first line conductor; and
         a second shared resistor pad electrically coupled to the second line conductor, wherein the first shared resistor pad and the second shared resistor pad are electrically isolated from each other;
      a load circuit portion comprising:
         a first load pad and a second load pad, wherein the first load pad and the second load pad are electrically isolated from each other and are configured to receive an electrical load;
         a first unshared resistor pad electrically coupled to the first load pad; and
         a second unshared resistor pad electrically coupled to the second load pad; and
      a first zero ohm resistor comprising a first end and a second end, wherein the first end is electrically coupled to the first shared resistor pad,
      wherein the first zero ohm resistor is configurable by a user after manufacturing, and
      wherein the load circuit portion is electrically isolated from the line circuit portion in the absence of the at least one zero ohm resistor being further electrically coupled to at the first unshared resistor pad.

17. The printed circuit board of claim 16, wherein the second end of the first zero ohm resistor is electrically coupled to the second shared resistor pad.

18. The printed circuit board of claim 16, further comprising:
   a second zero ohm resistor electrically coupled to the second shared resistor pad and the second unshared resistor pad, wherein the second end of the first zero ohm resistor is electrically coupled to the first unshared resistor pad, and wherein the load circuit portion further comprises the electrical load electrically coupled to the first load pad and the second load pad.

\* \* \* \* \*